United States Patent
Huang et al.

(10) Patent No.: US 7,528,628 B2
(45) Date of Patent: May 5, 2009

(54) VOLTAGE CONVERTER WITH AUTO-ISOLATION FUNCTION

(75) Inventors: Rei-Fu Huang, Tainan Hsien (TW); Shih-huang Huang, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 28 days.

(21) Appl. No.: 11/756,651

(22) Filed: Jun. 1, 2007

(65) Prior Publication Data

US 2008/0007315 A1    Jan. 10, 2008

Related U.S. Application Data

(60) Provisional application No. 60/805,480, filed on Jun. 22, 2006.

(51) Int. Cl.
*H03L 5/00* (2006.01)
*H03K 19/0175* (2006.01)

(52) U.S. Cl. .......................... 326/62; 326/81; 327/333

(58) Field of Classification Search ............. 326/62–63, 326/80–81; 327/306, 333
See application file for complete search history.

(56) References Cited

U.S. PATENT DOCUMENTS

| | | | | |
|---|---|---|---|---|
| 7,224,201 | B2 * | 5/2007 | Rao et al. | 326/80 |
| 7,230,475 | B2 * | 6/2007 | Choi et al. | 327/544 |
| 7,397,279 | B2 * | 7/2008 | Bhattacharya et al. | 326/80 |

* cited by examiner

*Primary Examiner*—Dinh T. Le
(74) *Attorney, Agent, or Firm*—Thomas, Kayden, Horstemeyer & Risley (57) ABSTRACT

The disclosure relates to a voltage converter, converting a first signal of a first voltage to output a second signal of a second voltage. A level shifter receives the first signal to generate the second signal. An isolation circuit is coupled to the output of the level shifter, passing the second signal out. When the input of voltage converter is floated, the isolation circuit stops passing the second signal as the output, instead, the isolation circuit outputs a substitution signal having a predetermined voltage level irrelevant to the input of the level shifter.

10 Claims, 12 Drawing Sheets

VOLTAGE CONVERTER WITH AUTO-ISOLATION FUNCTION

CROSS REFERENCE TO RELATED APPLICATIONS

This application claims the benefit of U.S. Provisional Application No. 60/805,480, filed Jun. 22, 2006.

BACKGROUND OF THE INVENTION

1. Field of the Invention

The invention relates to a system on chip (SOC), and more particularly, to isolation circuits in a level shifter.

2. Description of the Related Art

Figure 1:
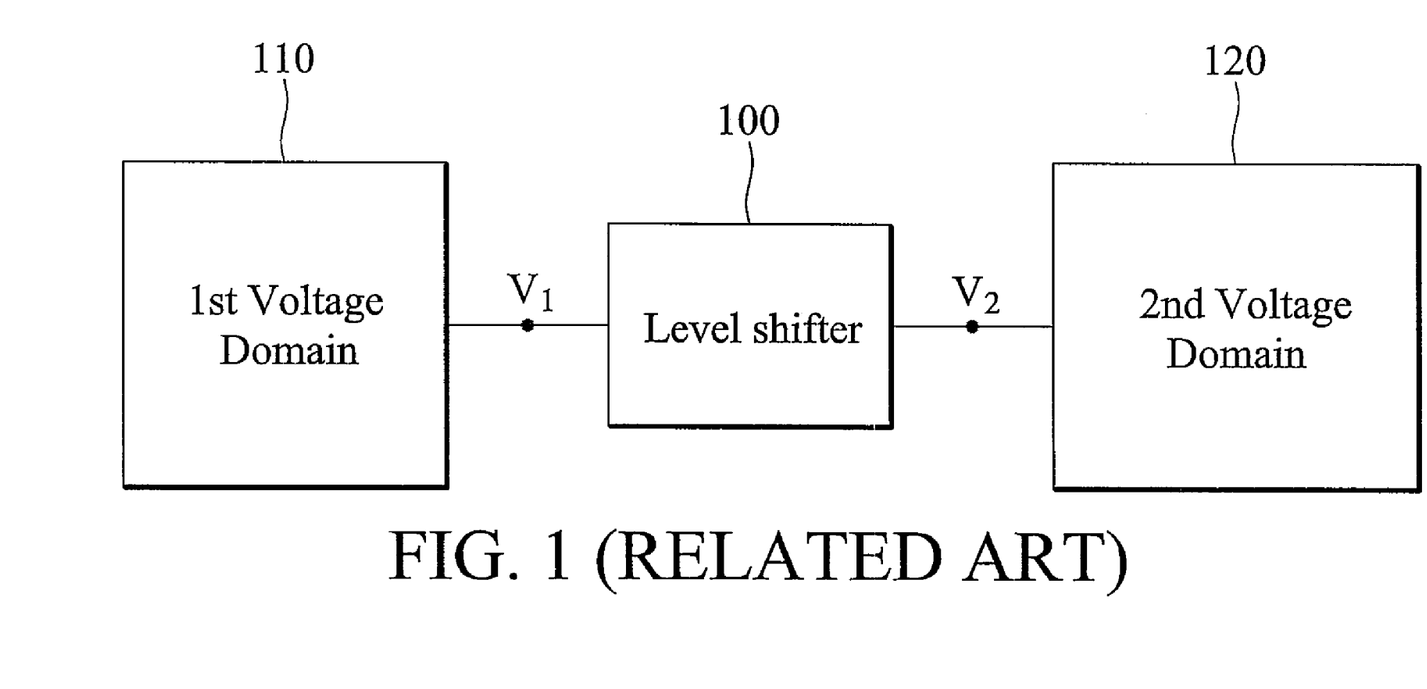
FIG. 1 shows a conventional system on chip (SOC) utilizing a level shifter 100.

FIG. 1 shows a conventional system on chip (SOC) utilizing a level shifter 100. Signals passed between the first voltage domain 110 and the second voltage domain 120 are converted by the level shifter 100 to adapt to the corresponding voltage domain. There are various known techniques for implementing level shifter 100, thus, a detailed description thereof is omitted. In an 500, however, the first voltage domain 110 or second voltage domain 120 may be selectively or occasionally powered down, switching the corresponding terminal on level shifter 100 to a floating state. For example, when the first terminal V1 is floating, the level shifter 100 may output an indeterminable signal to the second terminal V2. If the second voltage domain 120 receives the indeterminable signal, unexpected application errors may occur.

BRIEF SUMMARY OF THE INVENTION

Voltage converters are provided. An exemplary embodiment of a voltage converter converts a first signal of a first voltage to output a second signal of a second voltage. A level shifter receives the first signal to generate the second signal. An isolation circuit is coupled to the output of the level shifter for outputting the second signal. When the input of voltage converter is floating, the isolation circuit stops output of the second signal, instead, the isolation circuit outputs a substitution signal having a predetermined voltage level irrelevant to the input of the level shifter.

Another embodiment of the voltage converter is bi-directional, converting the first signal of a first voltage to and from a second signal of a second voltage. A level shifter comprising a first terminal and a second terminal, receives the first signal from the first terminal to generate the second signal on the second terminal, or conversely, receives the second signal from the second terminal to generate the first signal on the first terminal. A first isolation circuit is coupled to the second terminal of level shifter, passing the second signal outbound the voltage converter. When the first terminal is floating, the first isolation circuit stops passing the second signal, instead, the first isolation circuit outputs a substitution signal irrelevant to the input on the first terminal. A second isolation circuit is coupled to the first terminal of level shifter, passing the first signal outbound from the voltage converter. When the second terminal is floating, the second isolation circuit stops passing the first signal, instead, the second isolation circuit outputs a substitution signal irrelevant to the input on the second terminal.

The first isolation circuit may be a latch circuit that latches the latest status of the second signal when the first terminal is floating, or a pulling circuit that pulls the second signal to a predetermined voltage level when the first terminal is floating. The second isolation circuit is also a latch circuit or a pulling circuit. A detailed description is given in the following embodiments with reference to the accompanying drawings.

The first isolation circuit may be a latch circuit that latches the latest status of the second signal when the first terminal is floated, or a pulling circuit that pulls the second signal to a predetermined voltage level when the first terminal is floated. The second isolation circuit is also a latch circuit or a pulling circuit. A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 3a and 3b show embodiments of auto-latch circuits in the voltage converter 200a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
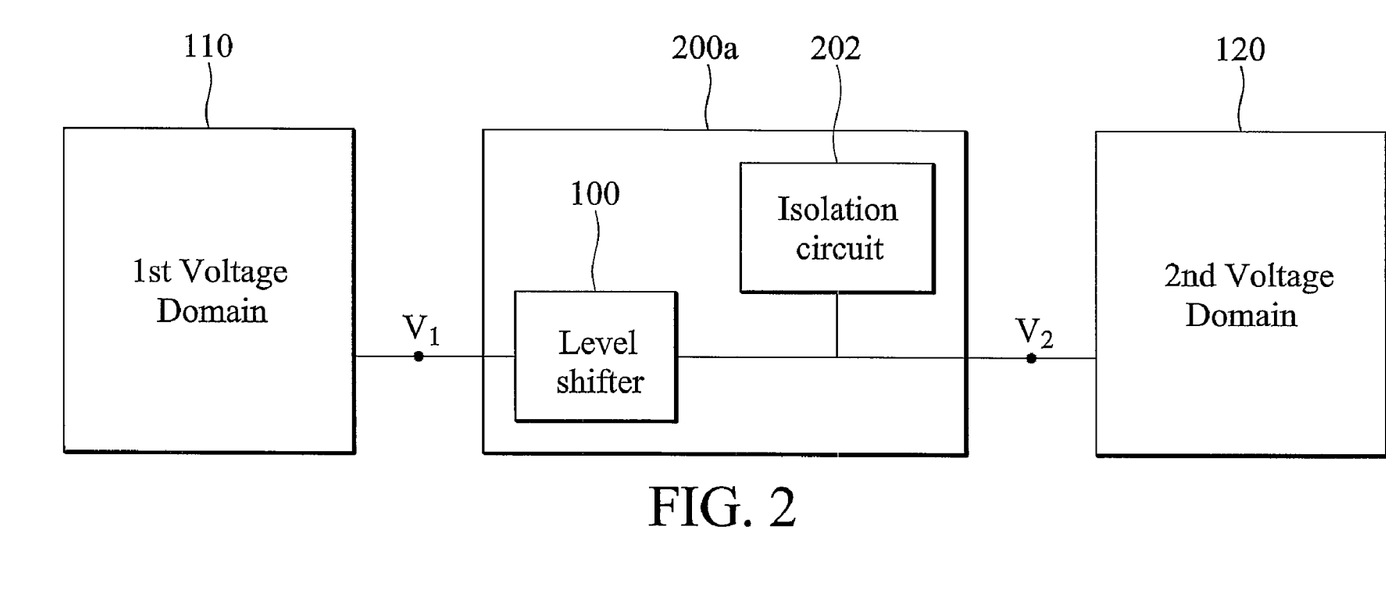
FIG. 2 shows an embodiment of SOC utilizing voltage conversion units with signal isolation.

FIG. 2 shows an embodiment of SOC utilizing voltage conversion units with automatic signal isolation. In FIG. 2, the voltage converter 200a has two terminals, a first terminal V1 and a second terminal V2 individually connected to the first voltage domain 110 and the second voltage domain 120. The voltage domain of signals sent from the first voltage domain 110 is converted to the voltage domain of the second voltage domain 120. The voltage converter 200a comprises a level shifter 100 and an isolation circuit 202. The isolation circuit 202 is coupled to the output of level shifter 100 and the input of second voltage domain 120. When the first voltage domain 110 operates normally, a signal sent to the first terminal V1 is converted and passed to the second terminal V2 bound for the second voltage domain 120. When the first voltage domain 110 powers down, the first terminal V1 is floated. In response, the isolation circuit 202 stops passing the converted signal to second terminal V2, and instead, the isolation circuit 202 outputs a substitution signal having a predetermined voltage level irrelevant to the input of the first terminal V1. The isolation circuit 202 automatically isolates an undetermined voltage level of the output of the level shifter 100, and the isolation circuit 202 provides a substitution signal at the output of the level shifter 100. The term "automatically isolate" means that an isolation circuit does not need a control input. The isolation circuit only needs to be coupled to a voltage source and coupled to an output of a level shifter.

Figure 3A:
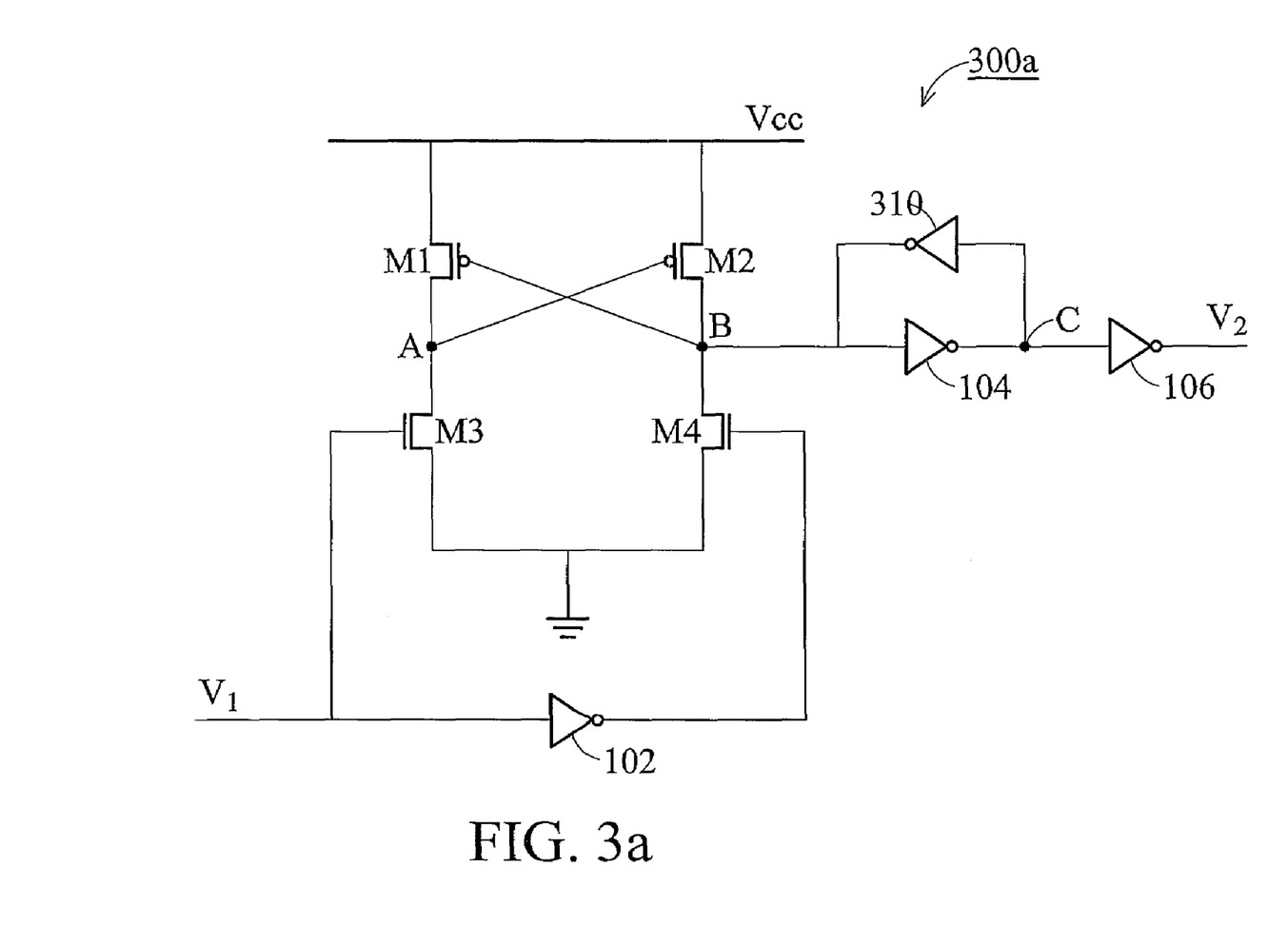
Figure 3B:
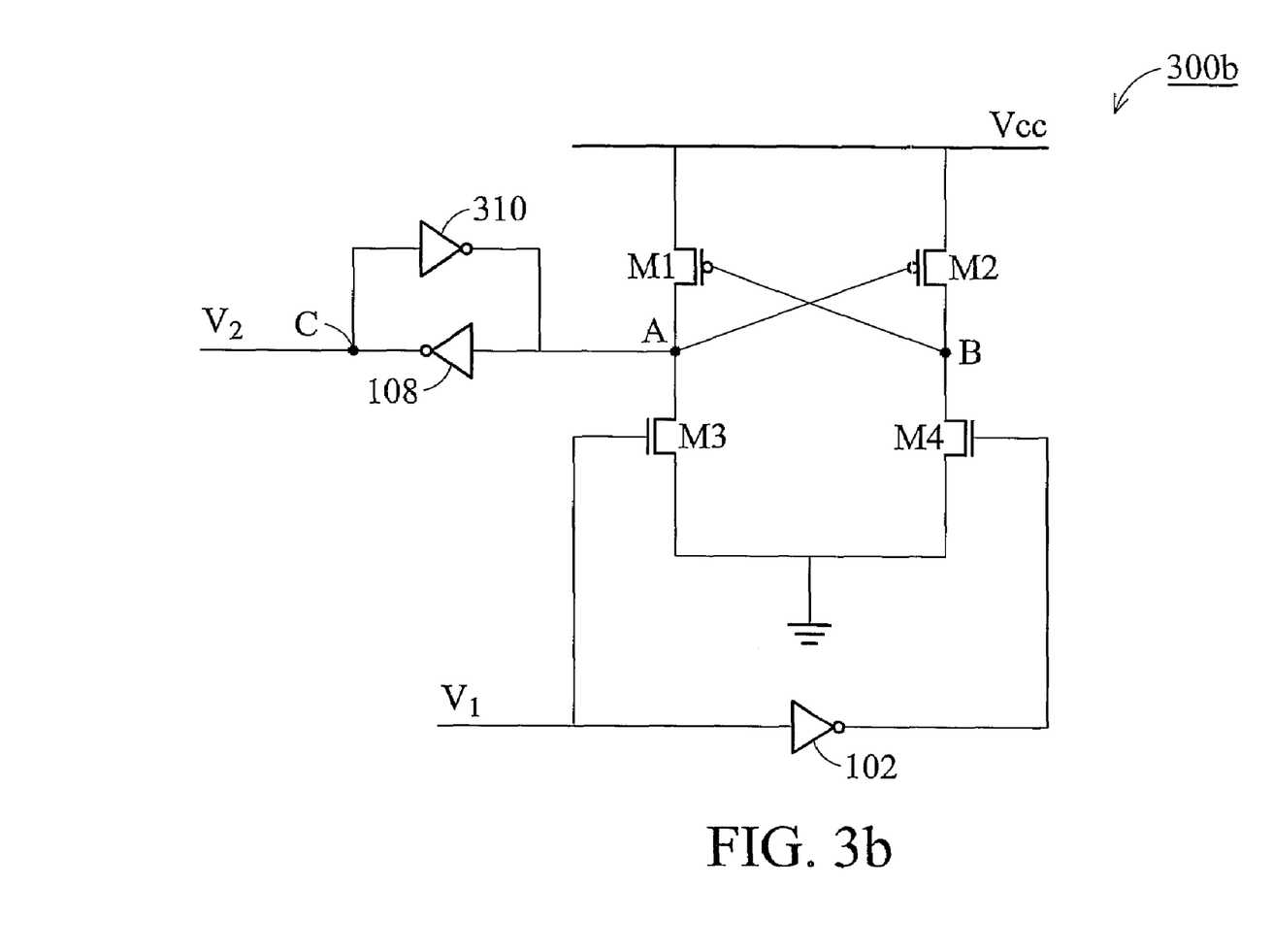

FIGS. 3a and 3b show embodiments of auto-latch circuits in the voltage converter 200a. In FIG. 3a, a typical level shifter 300a comprises transistors M1, M2, M3, and M4, and inverters 102, 104 and 106. Signals from the first terminal V1 are input to the transistor pairs M3 and M4, and the inverters 104 and 106 are serially coupled to the output terminal B for outputting converted signals. The isolation circuit 202 is implemented by an inverter 310 coupled to the inverter 104 in reverse, feeding the output of inverter 104 back to the input of the inverter 310. The inverter 310 and inverter 104 jointly form a latch circuit capable of latching the voltage at the node C. The inverter 310 is intentionally designed to be weaker than level shifter 300a, thus, when the input of level shifter 300a does not float, the output terminal is dominated by the level shifter 300a to output converted signals via the inverters 104 and 106. When the input of level shifter 300a is floated, voltage at the first terminal V1 becomes indeterminable, thus, the latch circuit formed by the inverters 310 and 104 turns out to be effective, preserving the latest status on node C and outputting it as a substitution signal. It is noted that throughout the detailed description, the level shifter 300a is used as an example. There are various types of level shifters known by persons skilled in the art. These various types of level shifters can be chosen by a circuit designer to implement an embodiment of the invention.

FIG. 3b shows a similar case using the complementary output terminal of level shifter 300b. In a conventional solution a first inverter 108 is coupled to the complementary output terminal A for output of a converted signal. An inverter 310 is added to form a latch circuit with the first inverter 108. Normally, the first inverter 108 outputs a converted signal to the second terminal V2 while the latching effect of inverter 310 is weaker. When voltage at the first terminal V1 becomes unstable, signals maintained by the inverter 310 override signals generated by the transistors M1 and M3, and the latest status on the second terminal V2 is latched and output as a substitution signal.

Figure 4A:
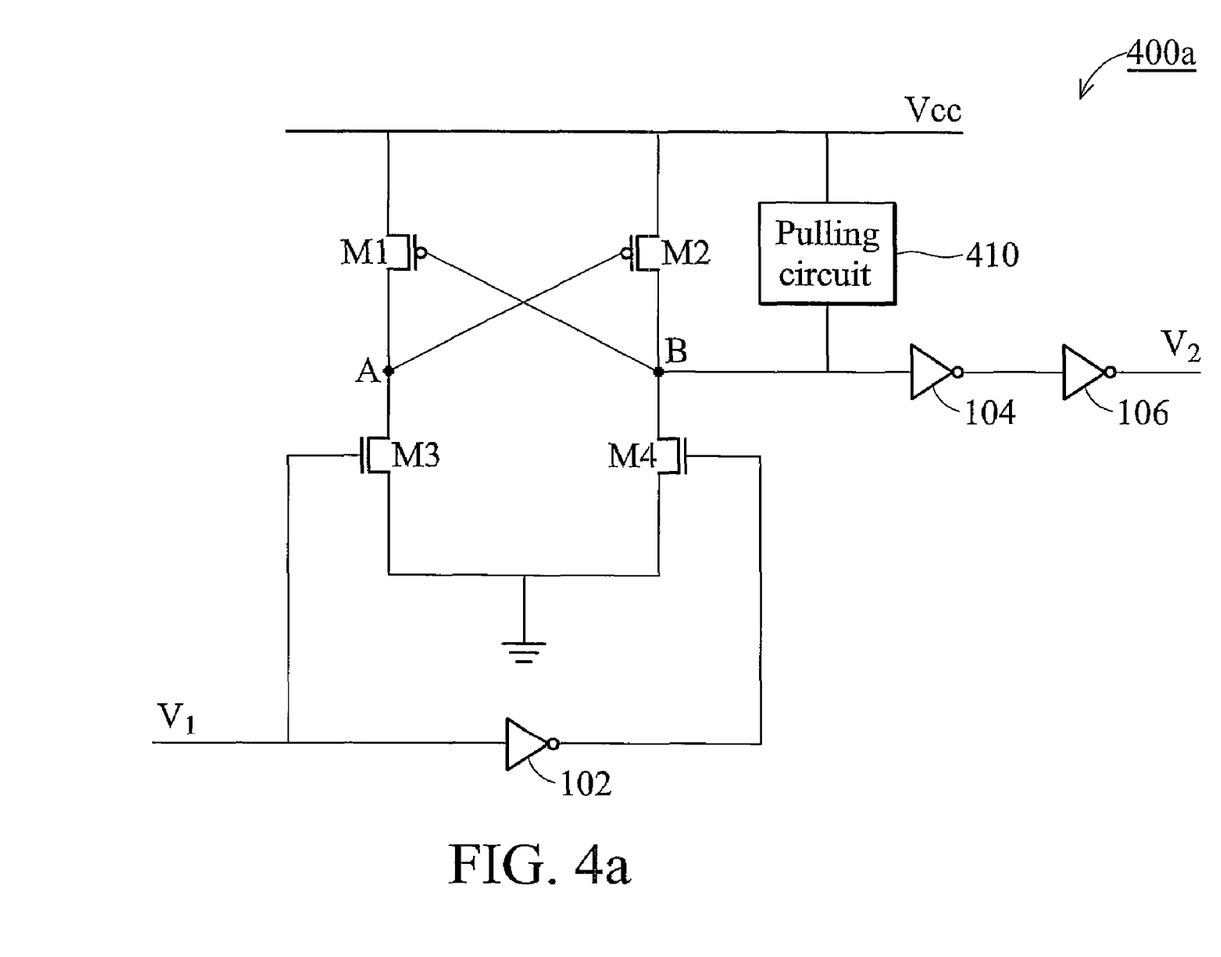
FIGS. 4a to 4f show embodiments of pulling circuits coupled to the output terminal of level shifter 100.

FIGS. 4a to 4f show embodiments of pulling circuits coupled to the output terminal of level shifter 400a. In FIG. 4a, the isolation circuit 202 is implemented as a pulling circuit 410, coupled to the supply voltage VCC and output terminal B, and is weaker than transistors M2 and M4. Normally, when the input of level shifter 400a is not floating, the voltage at the output terminal B is dominated by the M2 and M4 to output the converted signal. Conversely, when the input of level shifter 400a is floating, the pulling circuit 410 begins to dominate the voltage at the output terminal B, such that the substitution signal is output to the second terminal V2.

Figure 4B:
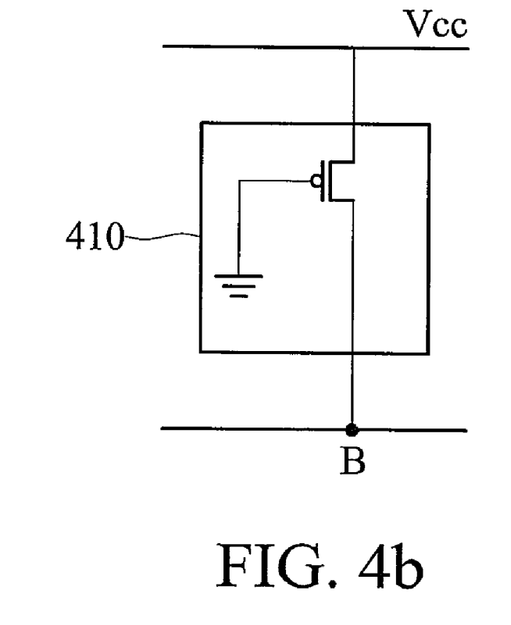

FIG. 4b shows an embodiment of the pulling circuit 410 implemented by a PMOS in which, the gate is grounded, and the source and drain are individually coupled to supply voltage VCC and the output terminal B. This arrangement tends to constantly pull the voltage at the output terminal B to the supply voltage VCC. To make the POMS weaker, the PMOS is implemented by a long channel device, such that when in normal operation, the voltage at the output terminal B is dominated by the transistors M2 and M4. When the input of level shifter 400a is floating, the voltage at the output terminal B is pulled to supply voltage VCC by the pulling circuit 410.

Figure 4C:
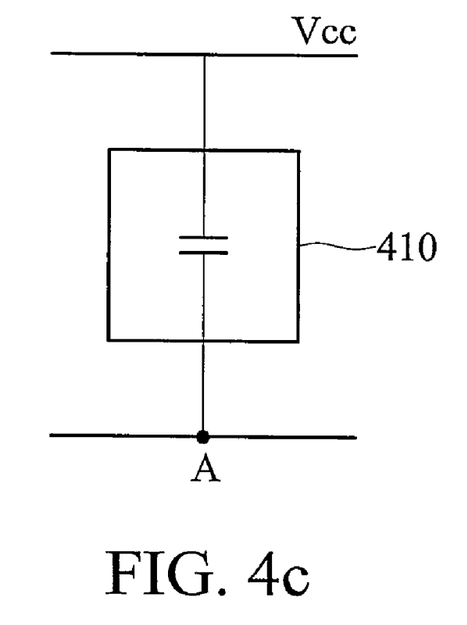

FIG. 4c shows an embodiment of the pulling circuit 410 implemented by a capacitor, with two terminals thereof coupled to the output terminal B and the supply voltage VCC. When the input of the level shifter 400a is floating, the transistor M2 and M4 are too weak to control the output terminal B with a strong driving capability. Subsequently, the output terminal B is charged (through M2) to a voltage level near VOC. Thus, the output terminal B is at a high state (logic 1). In this situation, the capacitor C has an effect to keep the output terminal B high and the voltage level of the terminal B is irrelevant to the floating input of the level shifter 400a. To make the capacitor weaker, the capacitor is designed to be small, such that when in normal operation, voltage at the output terminal B is dominated by transistors M2 and M4. When the input of level shifter 400a is floating, the voltage at the output terminal B is pulled to the supply voltage VCC by the pulling circuit 410.

Figure 4D:
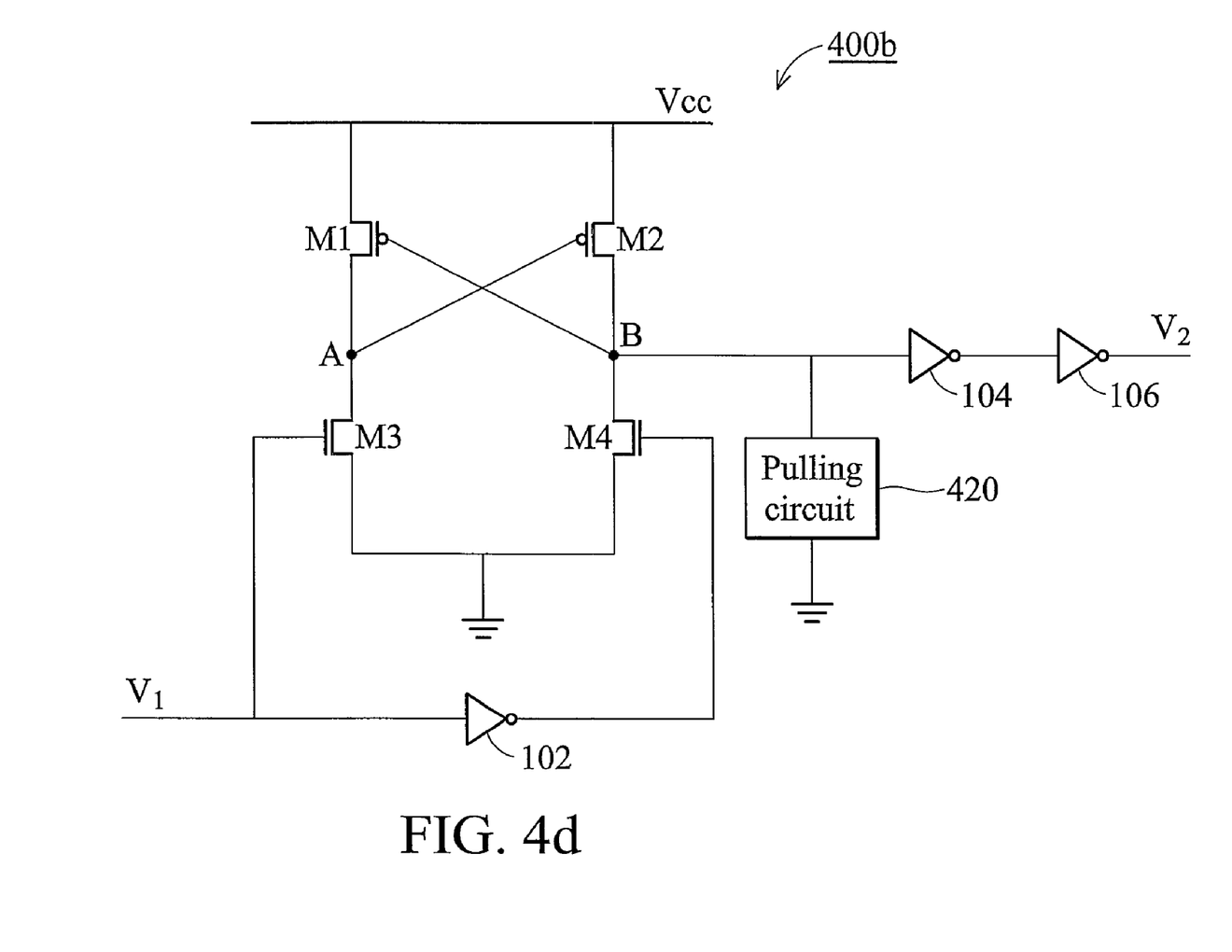

In FIG. 4d, the isolation circuit 202 is implemented as a pulling circuit 420, coupled between the ground and the output terminal B. The isolation circuit is weaker than level shifter 400b. The pulling circuit 420 tends to constantly pull the voltage at the output terminal B to ground. Typically, when the input of level shifter 400b is not floating the voltage at the output terminal B is dominated by the transistors M2 and M4 and the converted signal is output. Conversely, when the input of level shifter 400b is floating, the pulling circuit 420 begins to dominate the voltage at the output terminal B, such that the ground voltage is output to the second terminal V2 as the substitution signal.

Figure 4E:
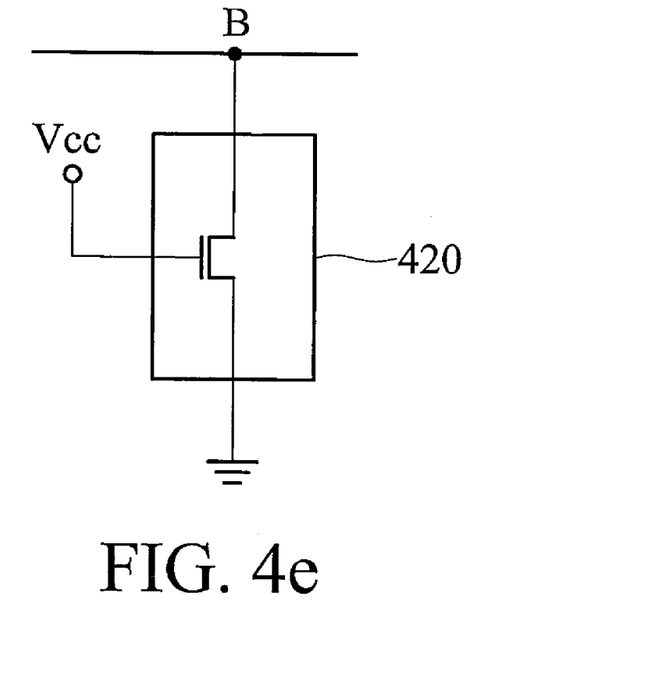

FIG. 4e shows an embodiment of the pulling circuit 420 implemented by a NMOS in which, the gate is coupled to the supply voltage VCC, and the source and drain are individually coupled to ground and the output terminal B. This arrangement tends to constantly pull the voltage at output terminal B to ground. To make the NMOS weaker, the NMOS is implemented by a long channel device such that when in normal operation, voltage at the output terminal B is dominated by transistors M2 and M4. When the input of level shifter 400b is floating, the voltage at the output terminal B is pulled to ground by the pulling circuit 420.

Figure 4F:
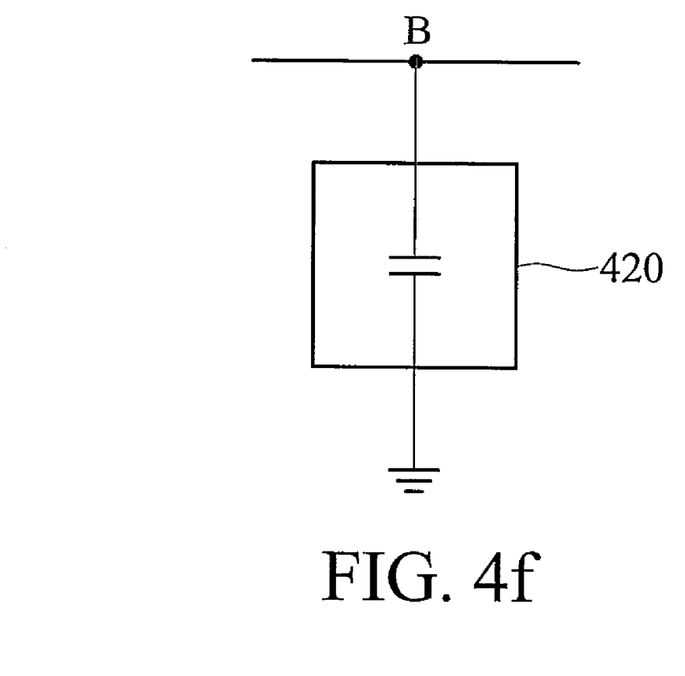

FIG. 4f shows another embodiment of the pulling circuit 420 implemented by a capacitor, with two terminals thereof coupled to the output terminal B and ground. When the input of the level shifter 400b is floating, the transistor M2 and M4 are too weak to control the output terminal B with a strong driving capability. Subsequently, the output terminal B is discharged (through M4) to a voltage level near GND (ground). Thus, the output terminal B is at a low state (logic 0). In this situation, the capacitor C has an effect to keep the output terminal B low and the voltage level of the terminal B is irrelevant to the floating input of the level shifter 400b. To make the capacitor weaker, the capacitor is designed to be small, such that when in normal operation, voltage at the output terminal B is dominated by transistors M2 and M4. When the input of level shifter 400b is floating, the voltage at the output terminal B is pulled to ground by the pulling circuit 420. The pulling circuits 410 and 420 are not limited to be the described capacitor or NMOS/PMOS, however, they can be any circuit capable of pulling the voltage to a predetermined level irrelevant to voltage at the first terminal V1.

FIGS. 5a to 5f show embodiments of pulling circuits coupled to the complementary output terminal A of the level shifter 500a. Since voltage at the complementary output terminal A is an inversion of the input at first terminal V1, a first inverter 108 is coupled to the complementary output terminal A to reverse the voltage and output a converted signal at the second terminal V2. The pulling circuit 510 is designed to be weak, tending to pull the voltage at the complementary output terminal A to a predetermined level. Similar to the embodiment described in FIG. 4a, when the input of level shifter 500a is not floating, the voltage at the complementary output terminal A is dominated by the transistors M1 and M3 to output a converted signal via the first inverter 108. When the input of level shifter 500a is floating, the voltage at the complementary output terminal A is dominated by the pulling circuit 510 to output a substitution signal via the first inverter 108.

Figure 5A:
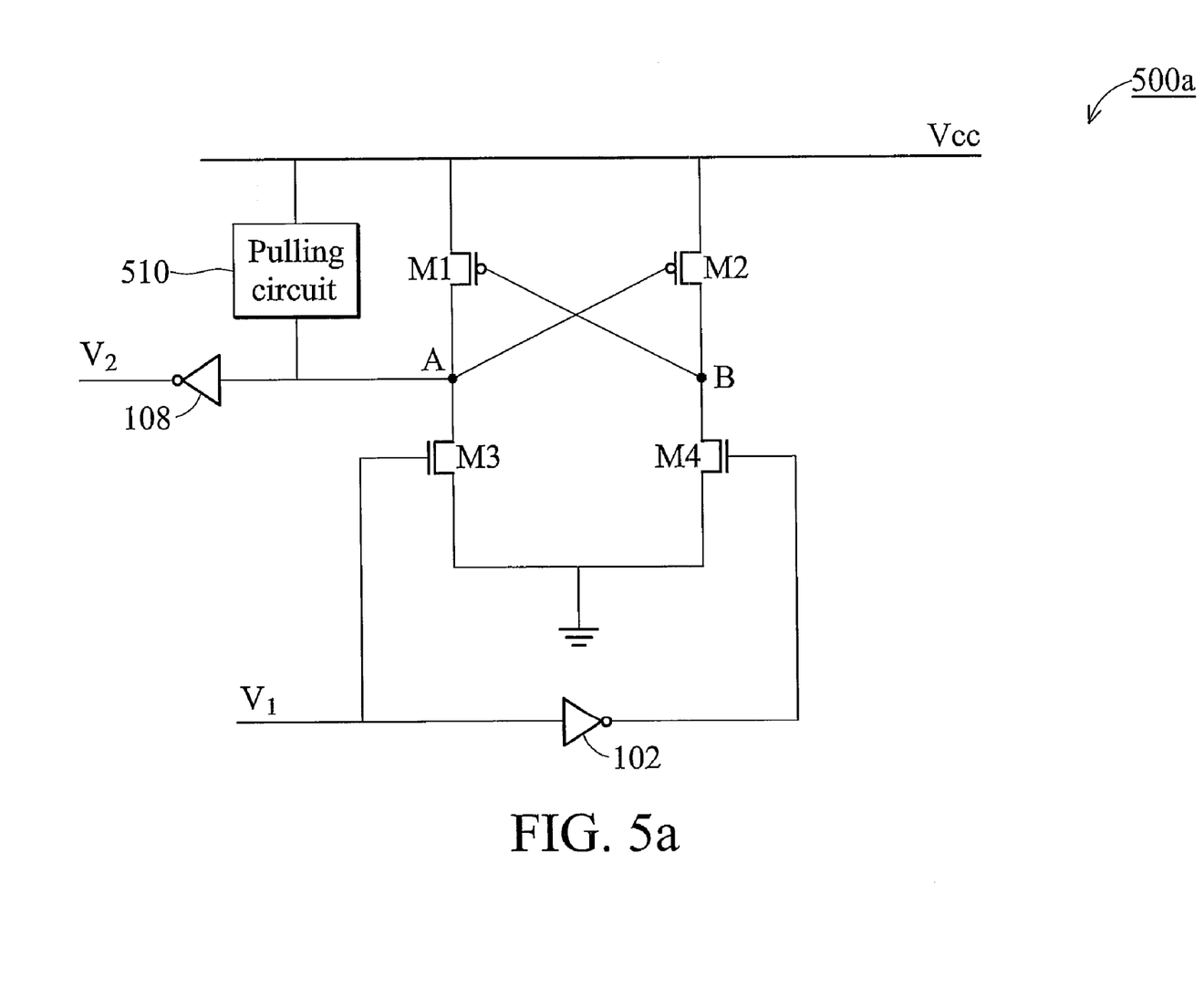
FIGS. 5a to 5f show embodiments of pulling circuits coupled to the complementary output terminal of level shifter 100.
Figure 5B:
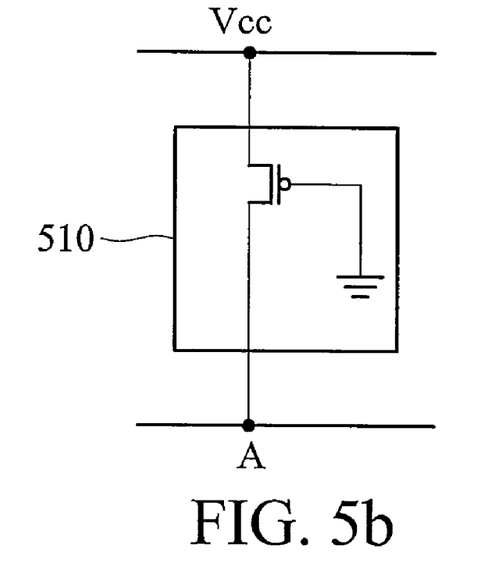

FIG. 5b shows an embodiment of the pulling circuit 510 implemented by a PMOS. In which, the gate is grounded, and the source and drain are individually coupled to supply voltage VCC and the complementary output terminal A. This arrangement tends to constantly pull the voltage at the complementary output terminal A to supply voltage VCC. To make the PMOS weaker, the PMOS is implemented by a long channel device, such that when in normal operation, voltage at the complementary output terminal A is dominated by M1 and M3. When the input of level shifter 500*a* is floating, the voltage at the complementary output terminal A is pulled to supply voltage VCC by the pulling circuit 510. Through the first inverter 108, a ground signal is output to second terminal V2 as a substitution signal.

Figure 5C:
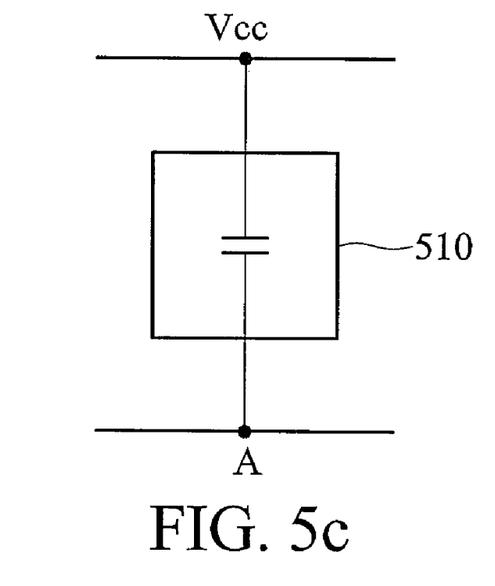

FIG. 5*c* shows an embodiment of the pulling circuit 510 implemented by a capacitor, with two terminals thereof coupled to the complementary output terminal A and the supply voltage VCC. When the input of the level shifter 500*a* is floating, the transistor M1 and M3 are too weak to control the output terminal A with a strong driving capability. Subsequently, the output terminal A is charged (through M1) to a voltage level near VOC. Thus, the output terminal A is at a high state (logic 1). In this situation, the capacitor C has an effect to keep the output terminal A high and the voltage level of the terminal A is irrelevant to the floating input of the level shifter 500*a*. To make the capacitor weaker, the capacitor is designed to be small, such that when in normal operation, voltage at the complementary output terminal A is dominated by transistors M1 and M3. When the input of level shifter 500*a* is floating, the voltage at the complementary output terminal A is pulled to supply voltage VCC by the pulling circuit 510. Similarly, a ground signal is output to the second terminal V2 as a substitution signal through the first inverter 108.

Figure 5D:
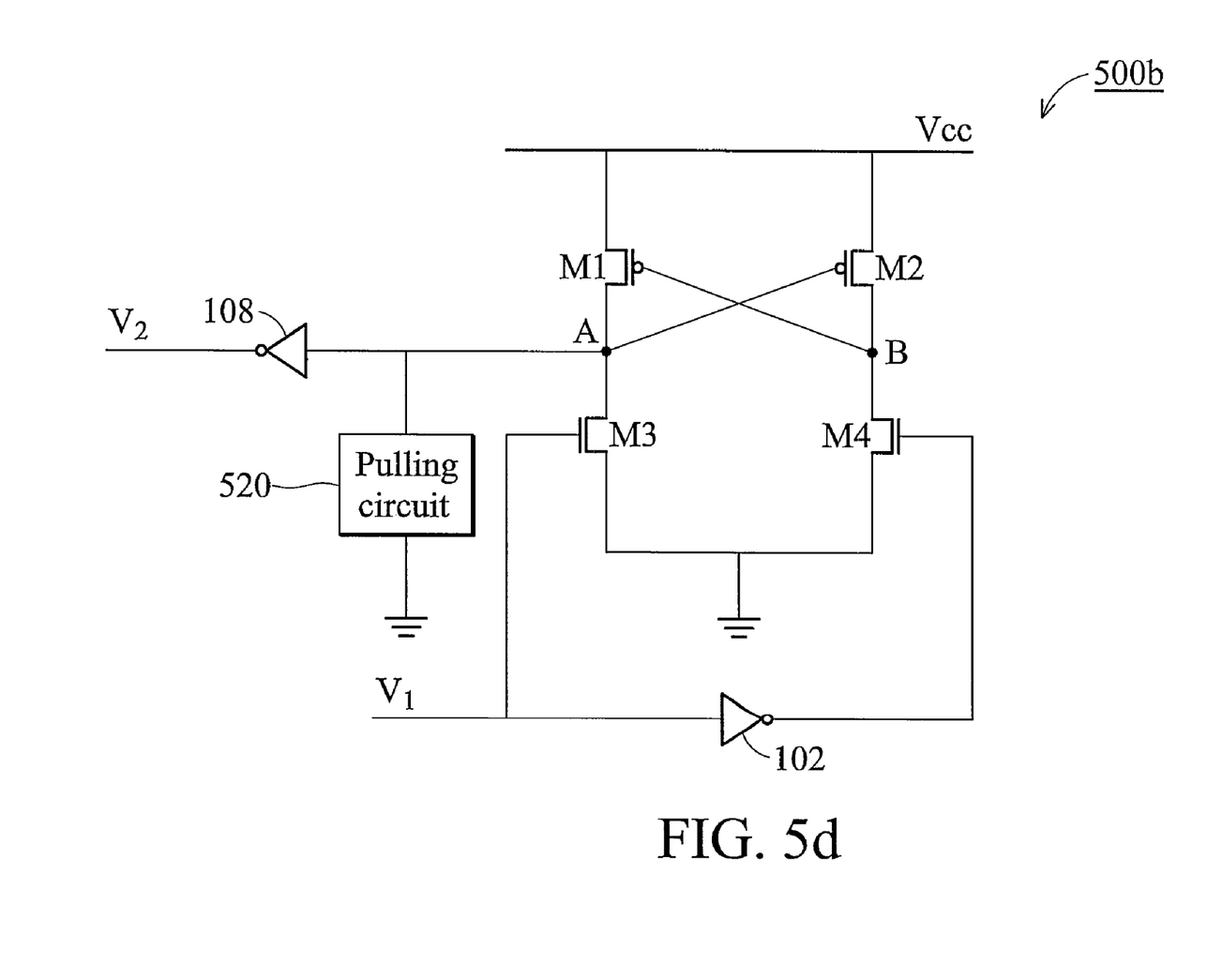

In FIG. 5*d*, the isolation circuit 202 is implemented as a pulling circuit 520 coupled between the ground and complementary output terminal A, weaker than level shifter 500*b*. The pulling circuit 520 tends to constantly pull the voltage at the complementary output terminal A to ground. Normally, when the input of level shifter 500*b* is not floating, the voltage at the complementary output terminal A is dominated by the transistors M1 and M3 to output the converted signal. Conversely, when the input of level shifter 500*b* is floating, the pulling circuit 510 begins to dominate the voltage at the complementary output terminal A, such that the voltage at the complementary output terminal A is pulled to ground. Through the first inverter 108, a high voltage is output to the second terminal V2 as a substitution signal.

Figure 5E:
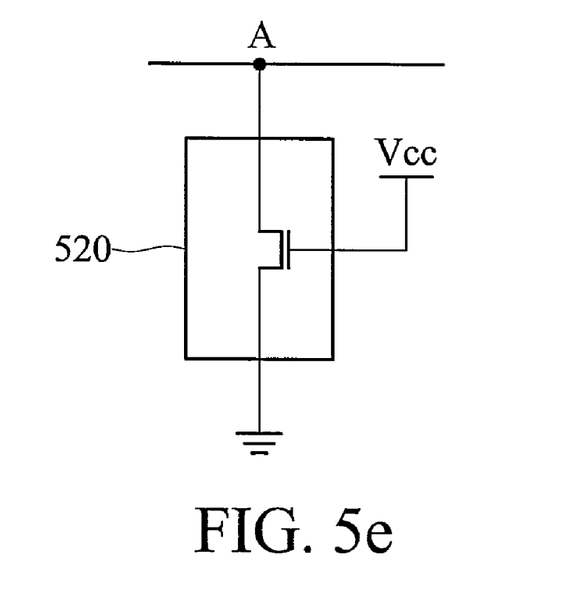

FIG. 5*e* shows an embodiment of the pulling circuit 520 implemented by a NMOS. In which, the gate is coupled to the supply voltage VCC, and the source and drain are individually coupled to ground and the complementary output terminal A. This arrangement tends to constantly pull the voltage at the complementary output terminal A to ground. To make the NMOS weaker, the NMOS is implemented by a long channel device, such that when in normal operation, voltage at the complementary output terminal A is dominated by transistors M1 and M3. When the input of level shifter 500*b* is floating, the voltage at the complementary output terminal A is pulled to ground by the pulling circuit 520.

Figure 5F:
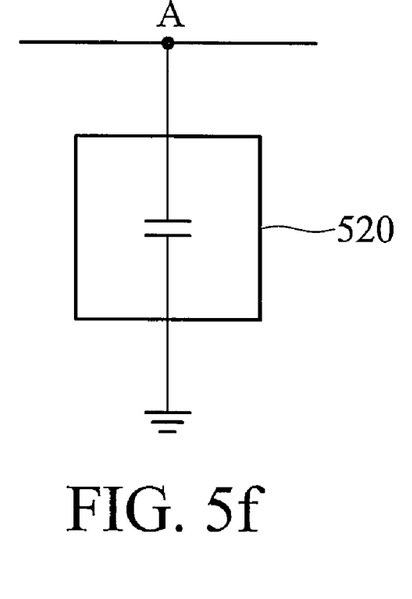

FIG. 5*f* shows another embodiment of the pulling circuit 520 implemented by a capacitor, with two terminals thereof coupled to the complementary output terminal A and ground. When the input of the level shifter 500*b* is floating, the transistor M1 and M3 are too weak to control the output terminal A with a strong driving capability. Subsequently, the output terminal A is discharged (through M3) to a voltage level near GND (ground). Thus, the output terminal A is at a low state (logic 0). In this situation, the capacitor C has an effect to keep the output terminal A low and the voltage level of the terminal A is irrelevant to the floating input of the level shifter 500*b*. To make the capacitor weaker, the capacitor is designed to be small, such that when in normal operation, voltage at the complementary output terminal A is dominated by transistors M1 and M3. When the input of level shifter 500*b* is floating, the voltage at the complementary output terminal A is pulled to ground by the pulling circuit 520. The pulling circuits 510 and 520 are not limited to be the described capacitor or NMOS/PMOS, to the contrary, they can be any circuit capable of pulling the voltage to a predetermined level irrelevant to the input at the first terminal V1.

The level shifters in the embodiments can be uni-directional or bi-directional, and the implementation thereof is not limited to the described embodiments. The second isolation circuit 204 can be identical to the isolation circuit 202, thus, redundant descriptions are omitted. With the auto-isolation function implemented in the level shifters, a SOC achieves higher quality and performance with lower cost.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage converter, converting a first signal of a first voltage to output a second signal of a second voltage, comprising:
   a level shifter, receiving the first signal to generate the second signal; and
   an isolation circuit, coupled to an output of the level shifter, wherein when an input of the level shifter is floating, the isolation circuit outputs a substitution signal as an output signal of the level shifter, and the output signal is irrelevant to the floating input of level shifter;
   wherein the level shifter further comprises:
      an output terminal and a complementary output terminal, wherein the output of the level shifter is the output terminal; and
      a first inverter and a second inverter serially coupled to the output terminal for outputting the second signal;
   the isolation circuit is an inverter with an input terminal coupled to an output of the first inverter, feeding the output of the first inverter back to an input of the first inverter; wherein:
   when the input of level shifter is not floating, the output terminal is dominated by the level shifter to output the second signal via the first inverter and second inverter; and
   when the input of level shifter is floating, the inverter with the first inverter form a latch circuit to continue outputting a previous state of the second signal as the substitution signal.

2. A voltage converter, converting a first signal of a first voltage to output a second signal of a second voltage, comprising:
   a level shifter, receiving the first signal to generate the second signal; and
   an isolation circuit, coupled to an output of the level shifter, wherein when an input of the level shifter is floating, the isolation circuit outputs a substitution signal as an output signal of the level shifter, and the output signal is irrelevant to the floating input of level shifter;
   wherein the level shifter further comprises:

an output terminal and a complementary output terminal, wherein the output of the level shifter is the complementary output terminal; and
a first inverter coupled to the complementary output terminal for outputting the second signal;
the isolation circuit is an inverter with an input terminal coupled to an output of the first inverter, feeding the output of the first inverter back to an input of first inverter; wherein:
when the input of level shifter is not floating, the complementary output terminal is dominated by the level shifter to output the second signal via the first inverter; and
when the input of level shifter is floating, the inverter with the first inverter form a latch circuit to continue outputting a previous state of the second signal as the substitution signal.

3. A voltage converter, converting a first signal of a first voltage to output a second signal of a second voltage, comprising:
a level shifter, receiving the first signal to generate the second signal; and
an isolation circuit, coupled to an output of the level shifter, wherein when an input of the level shifter is floating, the isolation circuit outputs a substitution signal as an output signal of the level shifter, and the output signal is irrelevant to the floating input of level shifter;
wherein:
the level shifter comprises an output terminal and a complementary output terminal, the output of the level shifter is the output terminal;
the isolation circuit is a pulling circuit coupled to the output terminal wherein:
when the input of level shifter is not floating, the output terminal is dominated by the level shifter to output the second signal; and
when the input of level shifter is floating, the output terminal is dominated by the pulling circuit to output a predetermined voltage as the substitution signal wherein:
the pulling circuit is a capacitor having two terminals respectively coupled to a supply voltage VCC and the output terminal;
when the input of level shifter is floating, a voltage level of the output terminal is increased to become a logic high state.

4. The voltage converter as claimed in claim 3, wherein:
the pulling circuit is a PMOS, a gate of the PMOS being grounded, a source and a drain of the PMOS being coupled to a supply voltage VCC and the output terminal respectively; and
when the input of level shifter is floating, the output terminal is pulled to supply voltage VCC by the pulling circuit.

5. The voltage converter as claimed in claim 3, wherein:
the pulling circuit is a NMOS, a gate of the NMOS being coupled to a supply voltage, a source and a drain of the NMOS being coupled to ground and the output terminal respectively;
when the input of level shifter is floating, the output terminal is pulled to ground by the pulling circuit.

6. The voltage converter as claimed in claim 3, wherein:
the pulling circuit is a capacitor having two terminals respectively coupled to ground and the output terminal;
when the input of level shifter is floating, a voltage level of the output terminal is decreased to become a logic low state.

7. A voltage converter, converting a first signal of a first voltage to output a second signal of a second voltage, comprising:
a level shifter, receiving the first signal to generate the second signal; and
an isolation circuit, coupled to an output of the level shifter, wherein when an input of the level shifter is floating, the isolation circuit outputs a substitution signal as an output signal of the level shifter, and the output signal is irrelevant to the floating input of level shifter;
wherein:
the level shifter comprises an output terminal and a complementary output terminal, wherein the output of the level shifter is the complementary output terminal, wherein a first inverter is coupled to the complementary for outputting the second signal;
the isolation circuit is a pulling circuit coupled to the complementary output terminal, such that when the input of level shifter is not floating, the complementary output terminal is dominated by the level shifter to output the second signal via the first inverter; and
when the input of level shifter is floating, the output terminal is dominated by the pulling circuit to output a predetermined voltage as the substitution signal via the first inverter,
wherein:
the pulling circuit is a capacitor having two terminals respectively coupled to a supply voltage and the complementary output terminal; and
when the input of level shifter is floating, a voltage level of the complementary output terminal is increased to become a logic high state, and the voltage level at the complementary terminal is inverted by the first inverter to generate the substitution signal.

8. The voltage converter as claimed in claim 7, wherein:
the pulling circuit is a PMOS, a gate of the PMOS being grounded, a source and a drain of the PMOS being coupled to a supply voltage and the complementary output terminal respectively; and
when the input of level shifter is floating, the complementary output terminal is pulled to supply voltage by the pulling circuit, and the voltage at the complementary terminal is inverted by the first inverter to generate the substitution signal.

9. The voltage converter as claimed in claim 7, wherein:
the pulling circuit is a NMOS, a gate of the NMOS being coupled to a supply voltage, a source and a drain of the NMOS being coupled to ground and the complementary output terminal respectively; and
when the input of level shifter floating, the complementary output terminal is pulled to ground by the pulling circuit, and the voltage at the complementary terminal is inverted by the first inverter to generate the substitution signal.

10. The voltage converter as claimed in claim 7, wherein:
the pulling circuit is a capacitor having two terminals respectively coupled to ground and the complementary output terminal; and
when the input of level shifter is floating, a voltage level of the complementary output terminal is decreased to become a logic low state, and the voltage level at the complementary terminal is inverted by the first inverter to generate the substitution signal.

* * * * *